(12) United States Patent
Nakanishi et al.

(10) Patent No.: US 10,770,855 B2
(45) Date of Patent: Sep. 8, 2020

(54) TERMINAL, BOARD CONNECTOR, BOARD WITH CONNECTOR AND TERMINAL PRODUCTION METHOD

(71) Applicant: Sumitomo Wiring Systems, Ltd., Yokkaichi, Mie (JP)

(72) Inventors: Yuichi Nakanishi, Mie (JP); Hidekazu Matsuda, Mie (JP); Hiroto Sakai, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 16/557,964

(22) Filed: Aug. 30, 2019

(65) Prior Publication Data

US 2020/0076147 A1 Mar. 5, 2020

(30) Foreign Application Priority Data

Sep. 3, 2018 (JP) .................. 2018-164559

(51) Int. Cl.
| | | |
|---|---|---|
| *H01R 43/02* | (2006.01) | |
| *H01R 12/71* | (2011.01) | |
| *H05K 3/46* | (2006.01) | |
| *H01R 43/16* | (2006.01) | |
| *H01R 43/24* | (2006.01) | |
| *H05K 13/04* | (2006.01) | |

(52) U.S. Cl.
CPC ....... *H01R 43/0256* (2013.01); *H01R 12/714* (2013.01); *H01R 12/716* (2013.01); *H01R 43/16* (2013.01); *H01R 43/24* (2013.01); *H05K 3/4661* (2013.01); *H05K 13/04* (2013.01)

(58) Field of Classification Search
CPC .... H01R 43/16; H01R 43/0256; H01R 43/24; H01R 12/714; H01R 12/716; H05K 3/4661
See application file for complete search history.

(56) References Cited

U.S. PATENT DOCUMENTS

| | | | | |
|---|---|---|---|---|
| 5,823,801 A | * | 10/1998 | Elkhatib | H01R 12/57 439/83 |
| 6,338,634 B1 | * | 1/2002 | Yu | H01R 4/028 439/83 |
| 6,379,161 B1 | * | 4/2002 | Ma | H01R 43/16 29/860 |
| 7,134,886 B2 | * | 11/2006 | Okamura | H01R 12/716 439/79 |
| 7,207,837 B2 | * | 4/2007 | Nakano | H05K 3/341 439/570 |
| 7,241,150 B2 | * | 7/2007 | Aihara | H01R 43/0256 439/83 |

(Continued)

FOREIGN PATENT DOCUMENTS

JP 2006-140042 6/2006

*Primary Examiner* — Abdullah A Riyami
*Assistant Examiner* — Nader J Alhawamdeh
(74) *Attorney, Agent, or Firm* — Gerald E. Hespos; Michael J. Porco; Matthew T. Hespos

(57) ABSTRACT

It is aimed to provide a terminal capable of realizing a cost reduction while maintaining solder wettability. The terminal has a board connecting portion to be connected to a circuit board, and includes a base and a plating layer. The base has a plated surface covered by the plating layer and an exposed surface. The plating layer on the board connecting portion has a first inclined surface for covering a slope connecting the plated surface and the exposed surface.

12 Claims, 15 Drawing Sheets

(56) References Cited

U.S. PATENT DOCUMENTS

| | | | | |
|---|---|---|---|---|
| 7,467,956 B2* | 12/2008 | Hirai | .................... | H05K 3/3426 |
| | | | | 439/541.5 |
| 8,974,244 B2* | 3/2015 | Aihara | ................. | H01R 12/724 |
| | | | | 439/374 |
| 9,136,635 B2* | 9/2015 | Muro | ..................... | H01R 12/57 |
| 9,668,347 B2* | 5/2017 | Endo | ................... | H01R 12/707 |
| 2003/0134530 A1* | 7/2003 | Yu-Feng | ............ | H01R 43/0256 |
| | | | | 439/83 |
| 2005/0227534 A1* | 10/2005 | Nakano | ................ | H01R 12/707 |
| | | | | 439/566 |
| 2006/0068620 A1* | 3/2006 | Okamura | ............. | H01R 12/716 |
| | | | | 439/79 |
| 2006/0216970 A1* | 9/2006 | Pavlovic | ................ | H01R 13/41 |
| | | | | 439/83 |
| 2010/0015864 A1* | 1/2010 | Zaitsu | ................... | H01R 43/16 |
| | | | | 439/885 |
| 2011/0111609 A1* | 5/2011 | Goto | .................... | H01R 12/585 |
| | | | | 439/83 |
| 2020/0076147 A1* | 3/2020 | Nakanishi | .............. | H01R 43/16 |

* cited by examiner

TERMINAL, BOARD CONNECTOR, BOARD WITH CONNECTOR AND TERMINAL PRODUCTION METHOD

BACKGROUND

Field of the Invention

This specification relates to a terminal, a board connector, a board with connector and a terminal production method.

Related Art

A board connector mounted on a circuit board by soldering includes a connector housing and terminals held in this connector housing. Tip parts of the terminals are fixed to the circuit board by solder.

A known post-plating method for producing terminals to be provided in a board connector includes stamping a plate material into the shape of terminals and, thereafter, plating the stamped material pieces. The terminal produced by the post-plating method includes a plating layer on the entire surface and thus ensures solder wettability. However, the post-plating method for applying plating one by one to the terminals stamped from the plate material increases production cost as compared to a pre-plating method for stamping terminals after plating is applied to a plate material.

To solve this problem, Japanese Unexamined Patent Publication No. 2006-140042 discloses a terminal production method by which plating is applied to plate surfaces of a plate material before stamping. A part of a plating layer is dragged in a stamping direction and forcibly expands stamped side surface parts, and plating is applied to the stamped side surface parts when the plated plate material is stamped.

The conventional terminal production method that uses the pre-plating method plates a terminal and then bends a part of the terminal, including a part to be connected to a board. However, terminal production cost inconveniently increases as compared to the case where bending is not performed.

Accordingly, the present invention aims to provide a terminal, a board connector, a board with connector and a terminal production method capable of reducing terminal production cost while maintaining solder wettability.

SUMMARY

The invention relates to a terminal with a board connecting portion to be connected to a circuit board. The board connecting portion includes a base a plating layer. The base has a plated surface covered by the plating layer and an exposed surface. The plating layer has a first inclined surface for covering a slope connecting the plated surface and the exposed surface in the board connecting portion.

The invention also relates to a board connector that includes the terminal configured as described above and a connector housing for holding the terminal.

The invention further relates to a board with the board connector configured as described above, a circuit board on which the board connector is mounted, and solder for connecting the circuit board and the board connecting portion. The exposed surface is arranged to face the circuit board.

Another aspect of the invention relates to a terminal production method for producing the terminal configured as described above. The method then includes applying plating to form plating layers on both surfaces of a plate material for a base member. The method thus obtains a plated plate. The method further includes stamping the plated plate to obtain a terminal piece having the plated surface and the exposed surface, and a rolling step of rolling the terminal piece to roll the plating layers and form the first inclined surfaces.

The board connecting portion may have a rising surface rising at an angle from the exposed surface and exposing the base, and the plating layer may have a second inclined surface for covering a slope connecting the plated surface and the rising surface.

The plating layer may contain Sn. The terminal may include a bent part. A thickness of the base may be 0.05 mm or more and 0.80 mm or less.

The exposed surface of the board with connector may be embedded in the solder.

The terminal production method may include electroplating in the plating process.

DETAILED DESCRIPTION

An embodiment of the present invention is described using the drawings.

A terminal of this embodiment has a board connecting portion to be connected to a circuit board and includes a base and a plating layer. The base has a plated surface covered by the plating layer and an exposed surface. The plating layer has a first inclined surface for covering a slope connecting the plated surface and the exposed surface in the board connecting portion.

The inventors studied a terminal production method adopting a pre-plating method to realize sufficient solder wettability and a reduction of terminal production cost. As a result, it was found out that sufficient solder wettability could be exhibited even in the case of adopting the pre-plating method if a direction in a stamping step was devised, slopes of a base member were formed in a rolling step, and a terminal was produced by sandwiching an exposed surface by the slopes.

The present inventors studied differences from conventional known terminals in characteristic points of the terminal realized by this terminal production method. As a result, the present inventors found out that the terminal according to this embodiment could realize a cost reduction while maintaining solder wettability by controlling the shapes of the plated surface and the exposed surface to be different from those of conventional terminals.

(Board with Connector 1)

Figure 1:
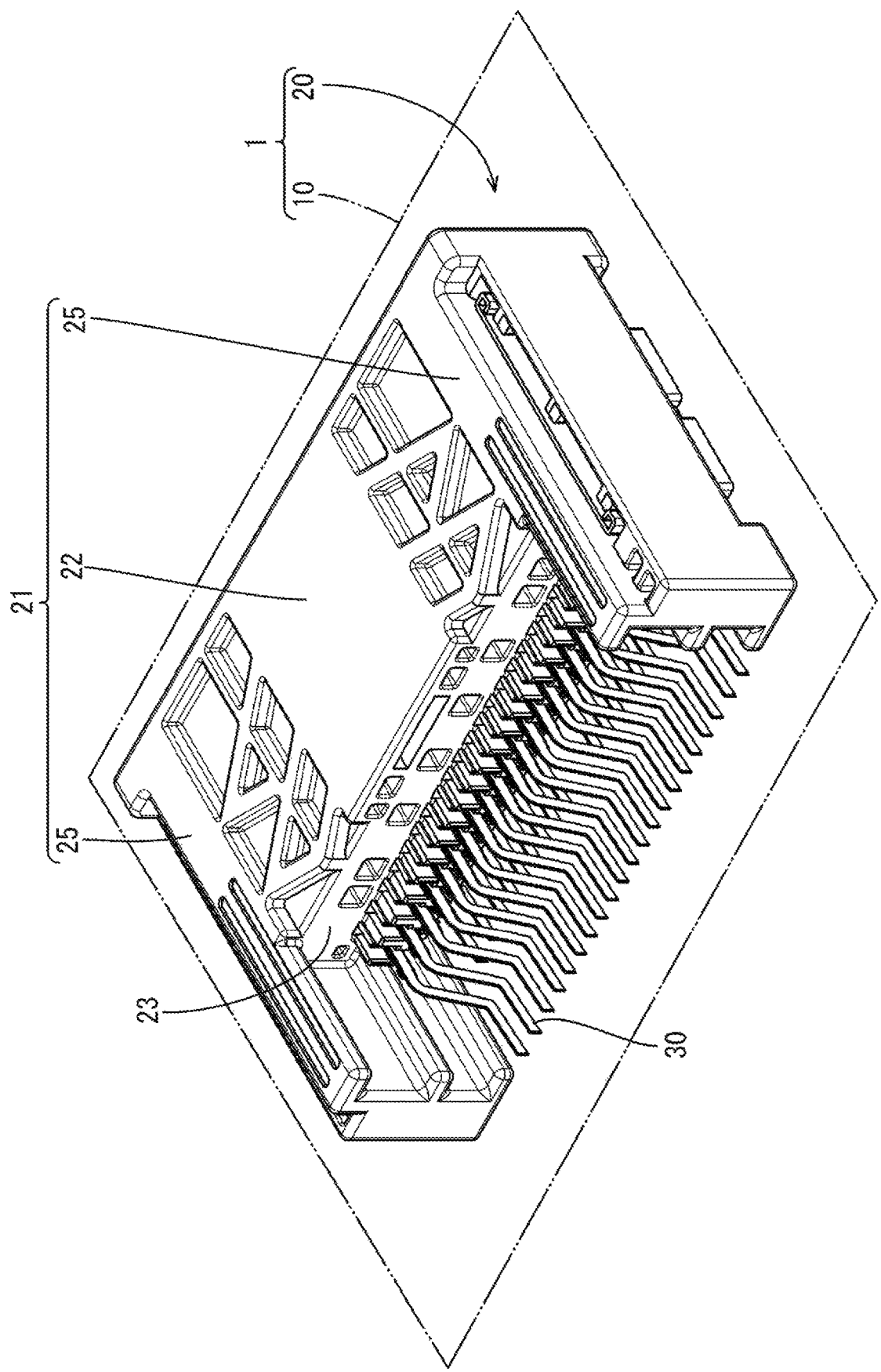
FIG. 1 is a perspective view of a board with connector according to an embodiment.

A board with connector 1 according to this embodiment includes a board connector 20, a circuit board 10 on which the board connector 20 is mounted and solder for connecting the circuit board and board connecting portions, as shown in FIG. 1.

The board with connector 1 according to this embodiment can be used in an automotive vehicle. A terminal according to this embodiment can be produced without a bending step of forming a board connecting portion 31 of a terminal 30. In this way, dimensional accuracy can be improved. Thus, the terminal 30 of this embodiment can exhibit suitable dimensional accuracy as compared to conventional terminals used in automotive vehicles even if the terminal 30 is a small terminal with a thin base.

(Circuit Board 10)

The circuit board 10 is not limited and a known circuit board can be selected according to the application of the board with connector. Specific examples of the circuit board 10 include a printed wiring board.

A printed wiring board in which conductive paths are formed and electronic components are mounted on one or both surfaces of an insulating plate made of an insulating material can be used.

(Board Connector 20)

As shown in FIG. 1, the board connector 20 includes the terminals 30 and a connector housing 21 for holding the terminals 30. The terminals 30 of the board connector 20 are connected to the conductive paths on the circuit board 10.

The connector housing 21 is a connecting member to which connectors, such as a mating connector housing, the terminals 30 and the circuit board 10 are connected.

The connector housing 21 may be made of resin.

As shown in FIG. 1, the connector housing 11 includes a housing body 22 and fixing walls 25 arranged across the housing body 22.

Figure 2:
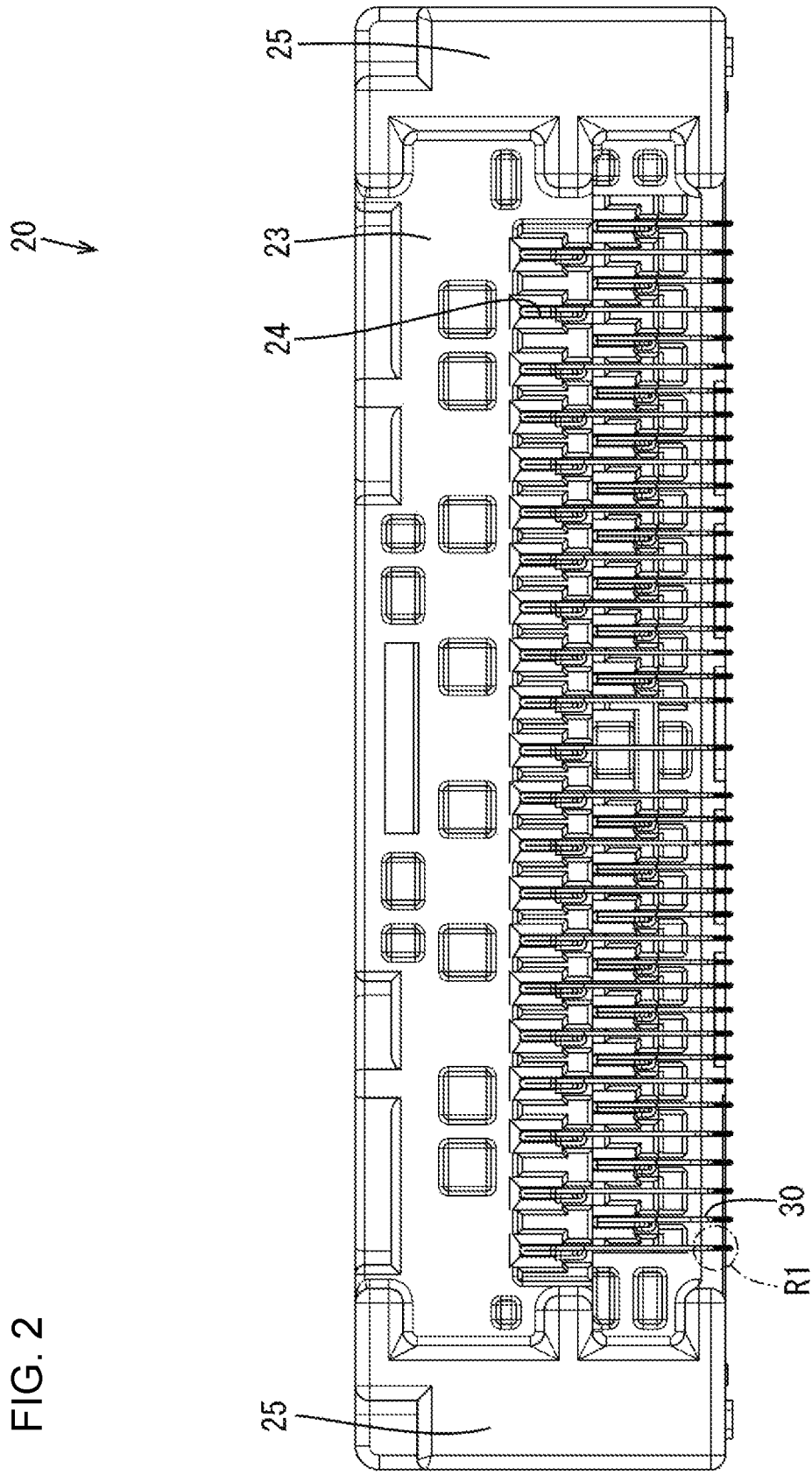
FIG. 2 is a back view of a board connector according to the embodiment.

The housing body 22 includes a terminal holding wall 23 for holding the terminals 30 and an accommodating portion for receiving a mating connector inside. The terminal holding wall 23 includes terminal press-fit holes 24 into which the terminals 30 are press-fit, as shown in FIG. 2.

Figure 3:
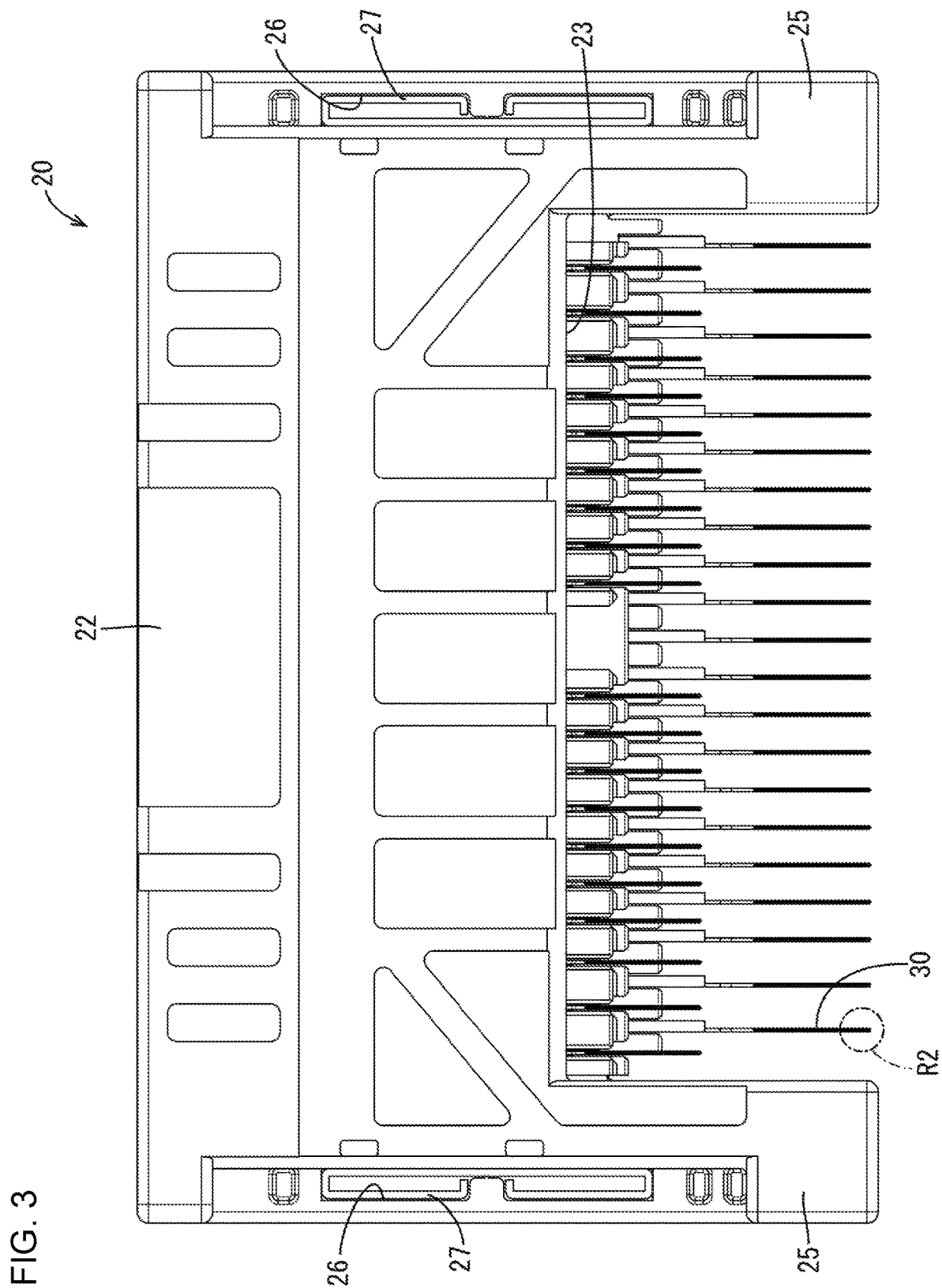
FIG. 3 is a bottom view of the board connector according to the embodiment.

The fixing walls 25 are for fixing the connector housing to the circuit board 10. As shown in FIG. 3, each fixing wall 25 includes a fixing bracket press-fit hole 26 to which a fixing bracket 27 is press-fit for fixing the connector housing 21 to the circuit board 10.

(Terminals 30)

Figure 4:
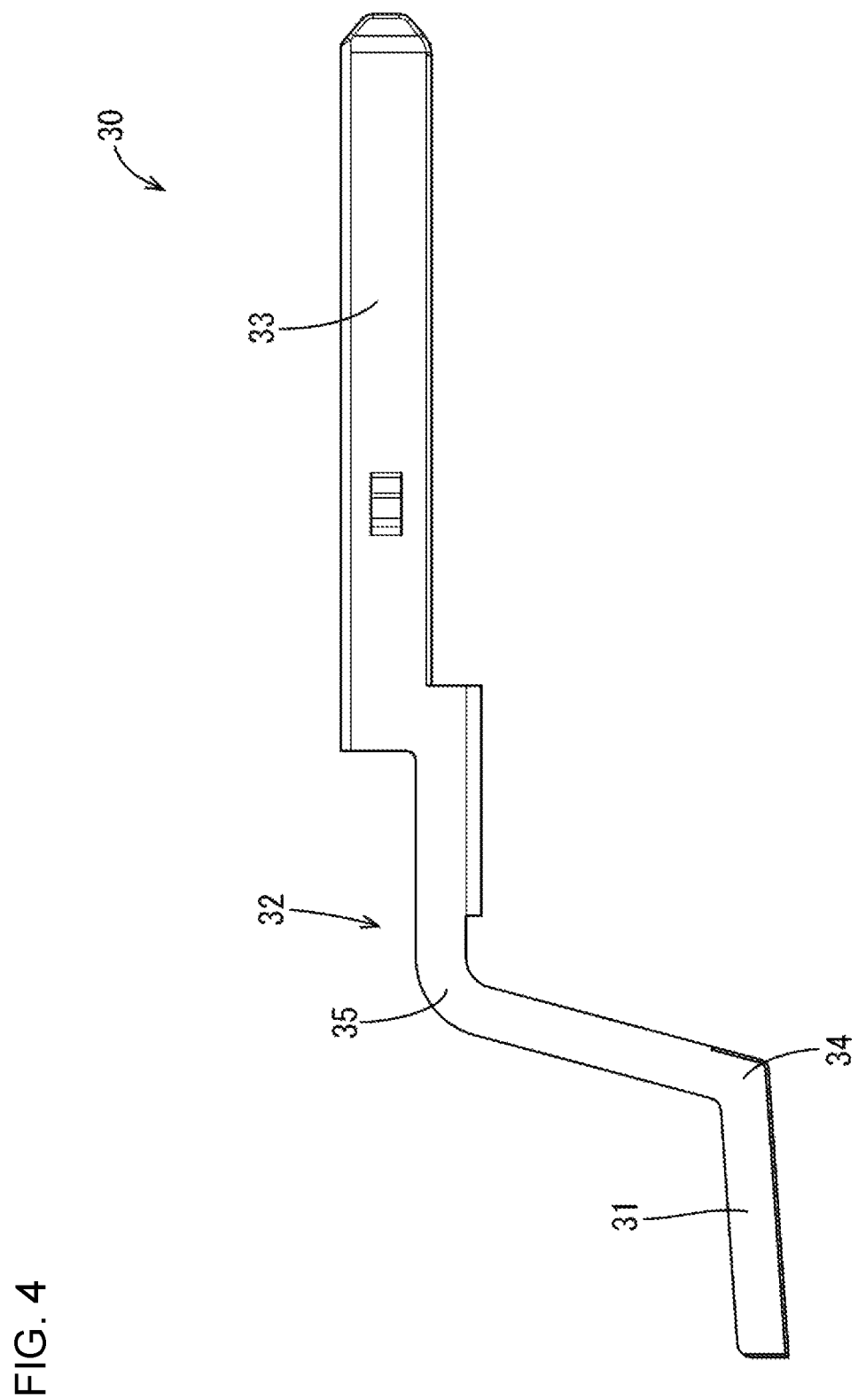
FIG. 4 is a side view of a terminal according to the embodiment.
Figure 5:
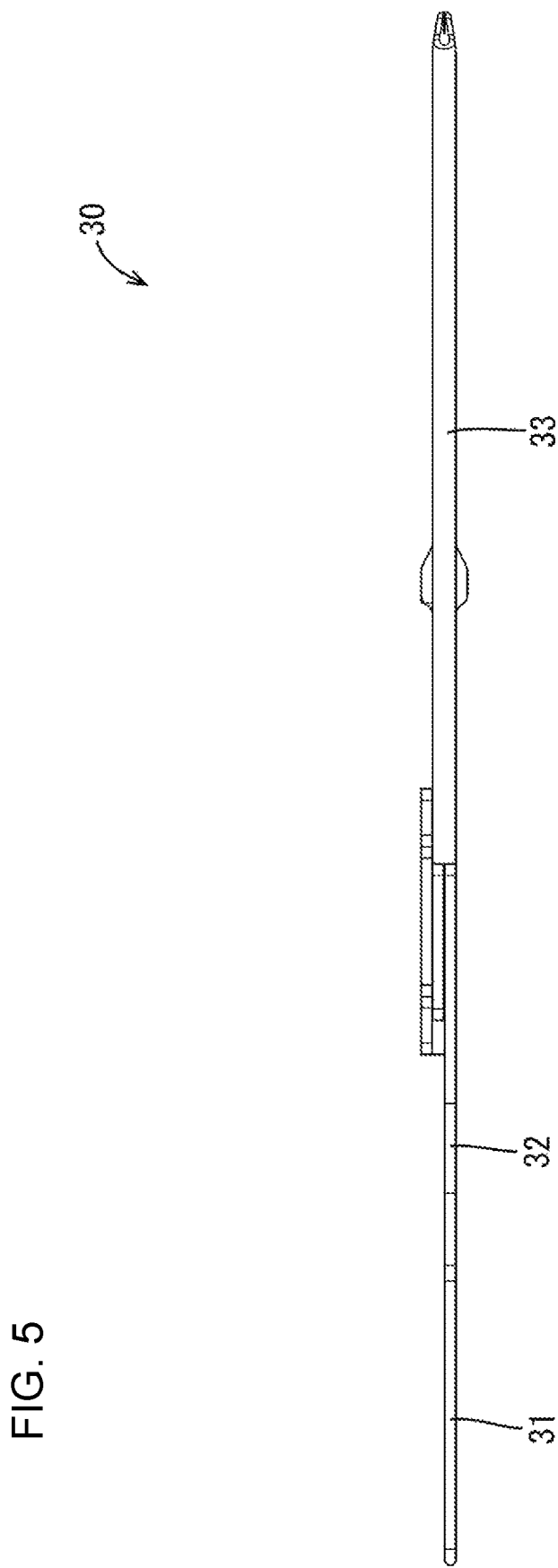
FIG. 5 is a plan view of the terminal according to the embodiment.

The terminal 30 of this embodiment is for electrically connecting the circuit board 10 and a mating component. The terminal 30 includes the board connecting portion 31 to be connected to the circuit board 10, a terminal connecting portion 33 to be connected to a terminal of the mating component and an intermediate portion 32 for connecting the board connecting portion and connecting portion 33, as shown in FIG. 4. The board connecting portion 31 and the circuit board 10 may be connected by soldering.

The terminal connecting portion 33 may be a male terminal or a female terminal. Note that the terminal 30 according to this embodiment may be bent to form the terminal connecting portion 33.

The terminal of this embodiment includes at least one bent part and preferably two or more bent parts. The bent parts are in the intermediate portion 32 and improve a degree of freedom in designing a component according to the board connector 20. As an example, FIG. 4 shows the terminal 30 with a first bent portion 34 and second bent portion 35.

The terminal 30 includes a base 41 and plating layers 44A and 44B. The surface of the base 41 has plated surfaces covered by the plating layers and an exposed surface.

The base 41 has slopes connecting the plated surfaces and the exposed surface. The plating layer has a first inclined surface for covering the slope of the base 41. The slopes and the first inclined surfaces have specific shapes formed by the production method for the terminal 30. These specific shapes enable the terminal 30 to exhibit suitable solder wettability for firmly fixing the circuit board 10 and the terminal 30.

The base 41 is not limited and a metal containing copper (Cu) can be used. Further, the plating layers 44A, 44B are not limited and metals such as tin (Sn), nickel (Ni), zinc (Zn) and chromium (Cr) can be used.

The base 41 and the plating layers 44A, 44B follow in a rolling step for adopting a post-plating method to be described later. In view of a following property, it is preferable to use the plating layers 44A, 44B containing, for example, tin (Sn). Further, in view of a following ability, it is more preferable to use a combination of the plating layers 44A, 44B containing tin (Sn) and the base 41 containing copper (Cu).

A thickness of the base 41 is preferably 0.05 mm or more, more preferably 0.07 mm or more, and even more preferably 0.08 mm or more. In this way, it is possible to improve the dimensional accuracy of the terminal 30 by suppressing the deformation of the base member 41 when plating layers 52 are rolled.

The thickness of the base 41 is preferably 0.80 mm or less, more preferably 0.70 mm or less and even more preferably 0.64 mm or less. In this way, it is possible to easily roll plating with less pressure and more suitably cover the terminal 30 with the plating layers 44A, 44B when the plating layers 52 are rolled. This is preferable in terms of being able to ensure sufficient solder wettability.

The arrangement of the terminal 30 in the board with connector 1 according to this embodiment is not limited.

The terminal 30 preferably is arranged such that the exposed surface faces the circuit board 10. In this way, a production cost of the terminal 30 can be reduced while the terminal 30 and the circuit board 10 are connected firmly by improved solder wettability.

Further, in the board with connector 1 according to this embodiment, the exposed surface may be embedded in solder. In this way, a production cost reduction of the terminal 30 can be realized while the terminal 30 and the circuit board 10 are connected firmly by sufficiently improving solder wettability.

Figure 9:
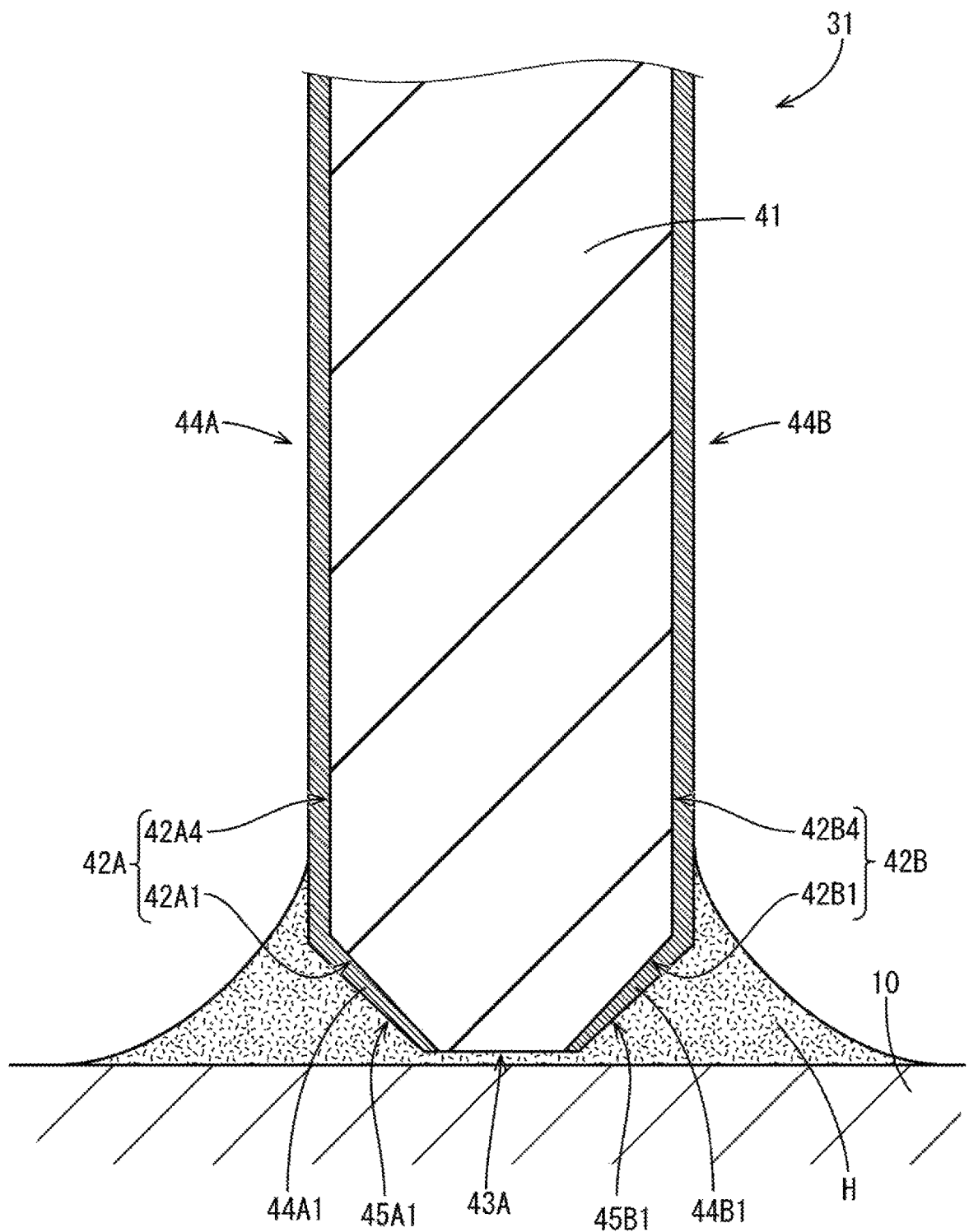
FIG. 9 is a section along A-A of FIG. 6 showing a state where the board connecting portion in the terminal according to the embodiment is soldered to a circuit board.
Figure 13:
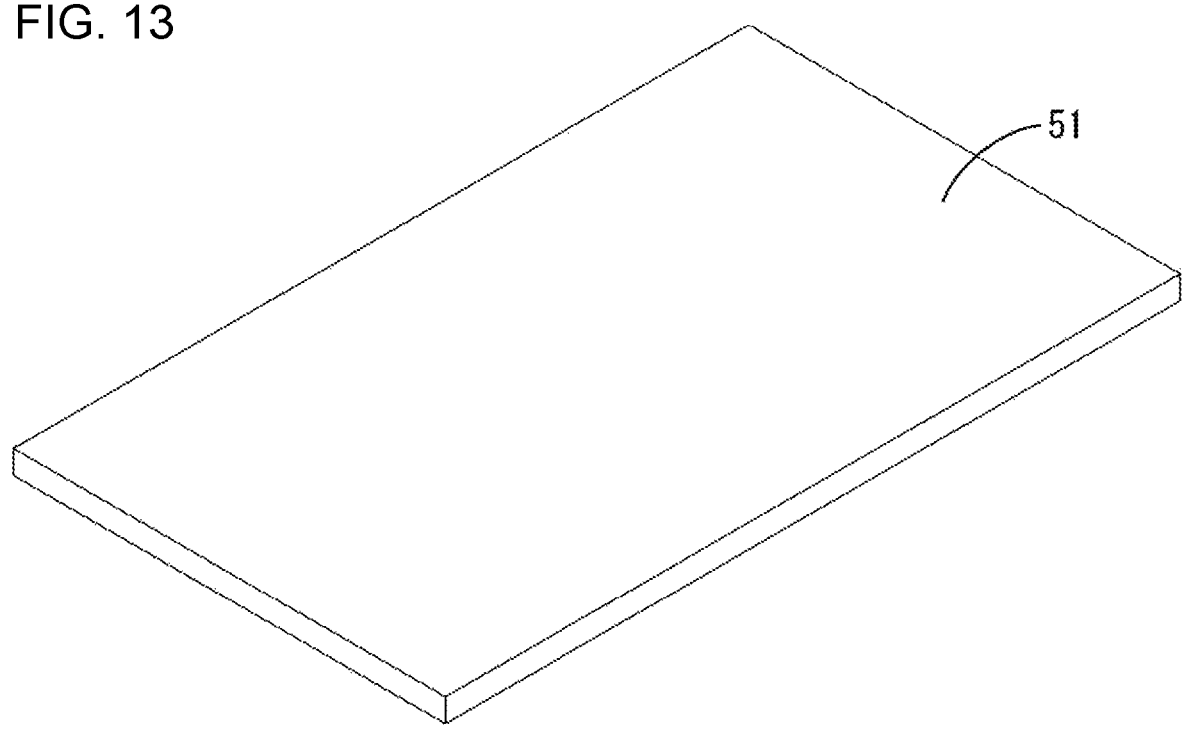
FIG. 13 is a perspective view of a metal plate material according to the embodiment.
Figure 14:
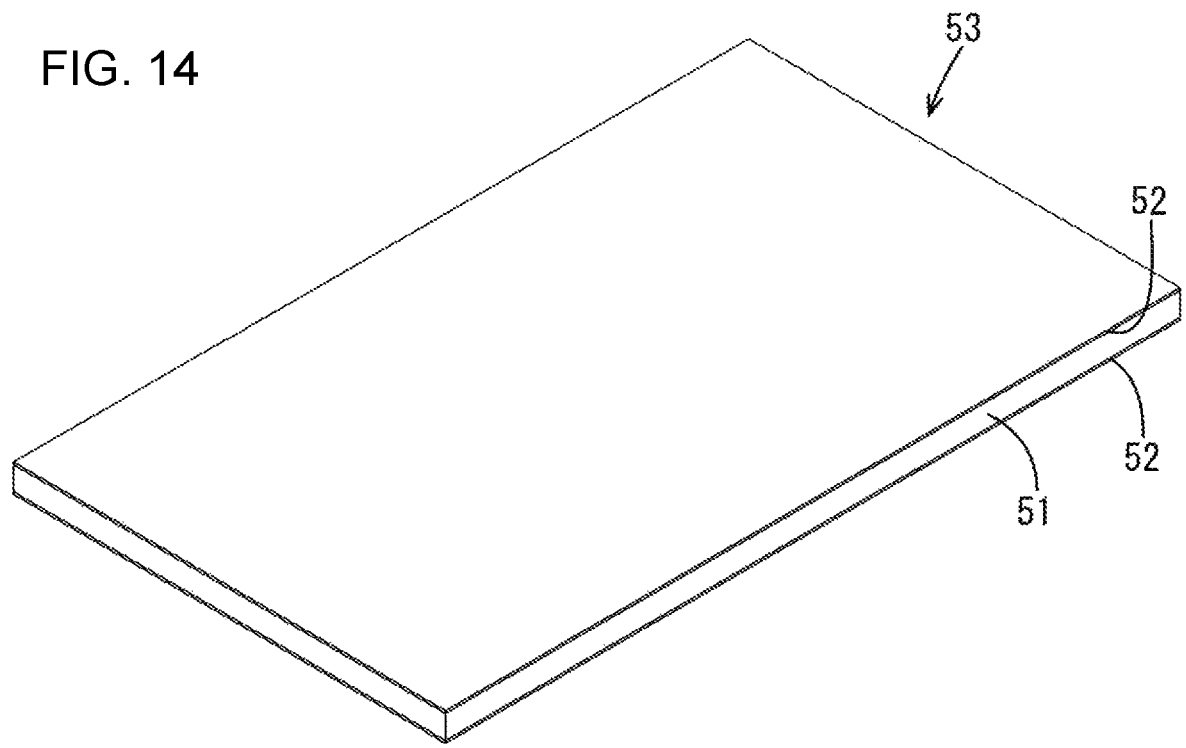
FIG. 14 is a perspective view of a plated plate according to the embodiment.
Figure 15:
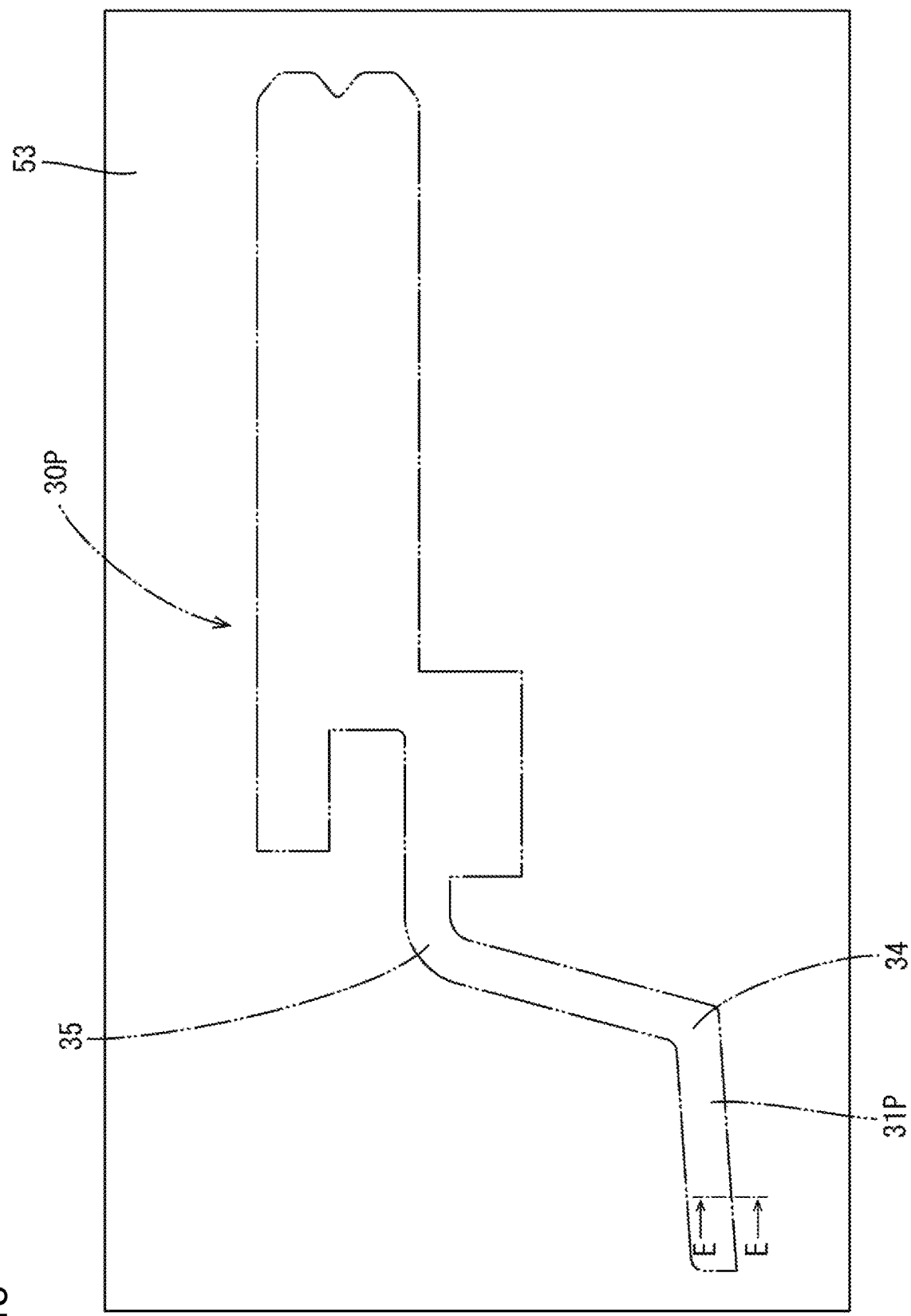
FIG. 15 is a plan view schematically showing a state of obtaining a terminal piece by a stamping step in a terminal production method according to the embodiment.

The terminal 30 is produced by stamping a plated plate 53 obtained by applying plating to both surfaces of a metal plate material 51, as shown in FIGS. 13, 14 and 15, and includes the plate-like base 41 and the plating layers 44A, 44B, as shown in FIG. 9. As shown in FIGS. 6, 9, 10 and 11, the base 41 has two plate surfaces 42A, 42B and an end 43 linking the plate surfaces 42A and 42B.

Figure 6:
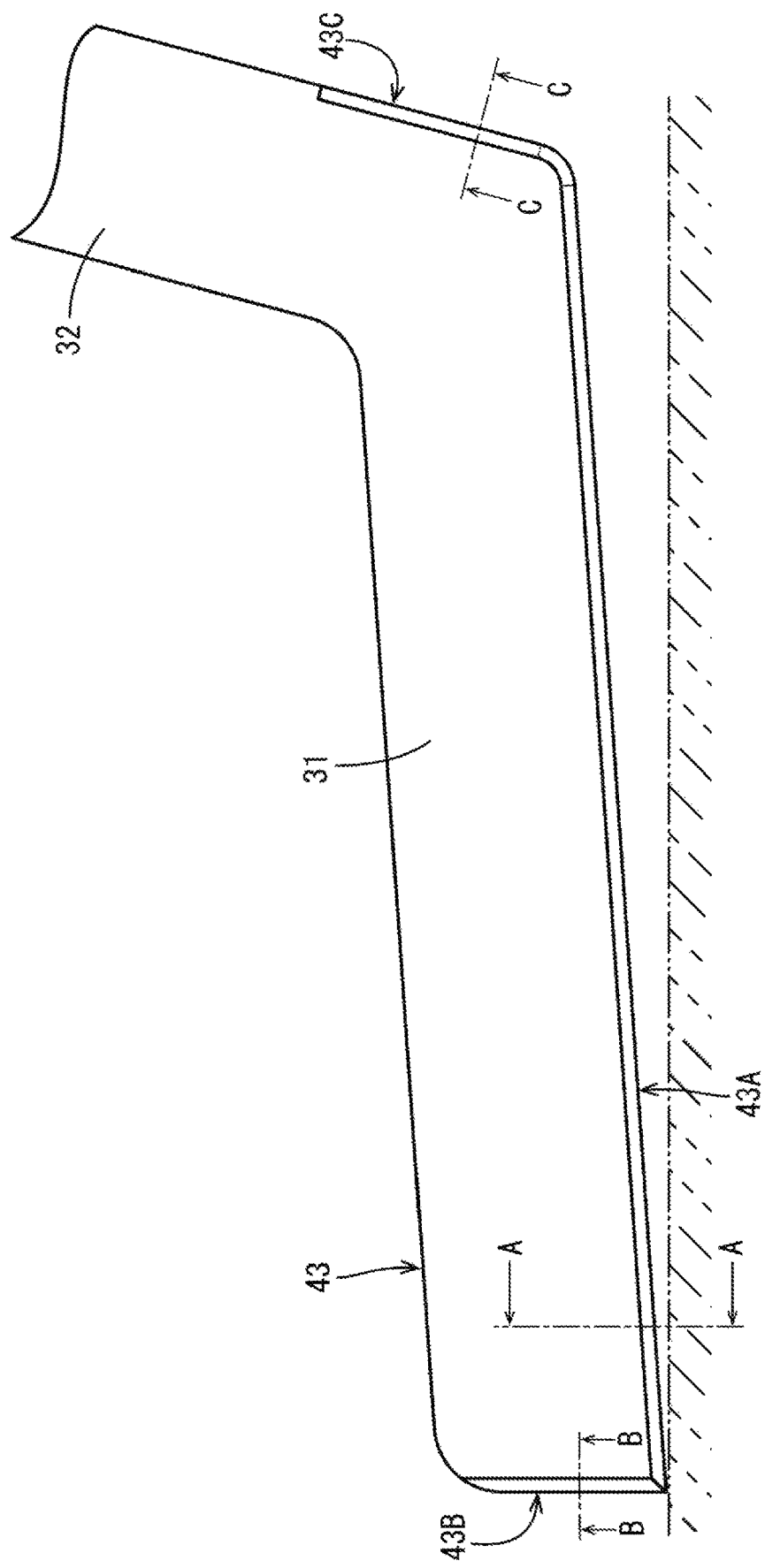
FIG. 6 is a partial enlarged side view showing a board connecting portion in the terminal according to the embodiment.
Figure 7:
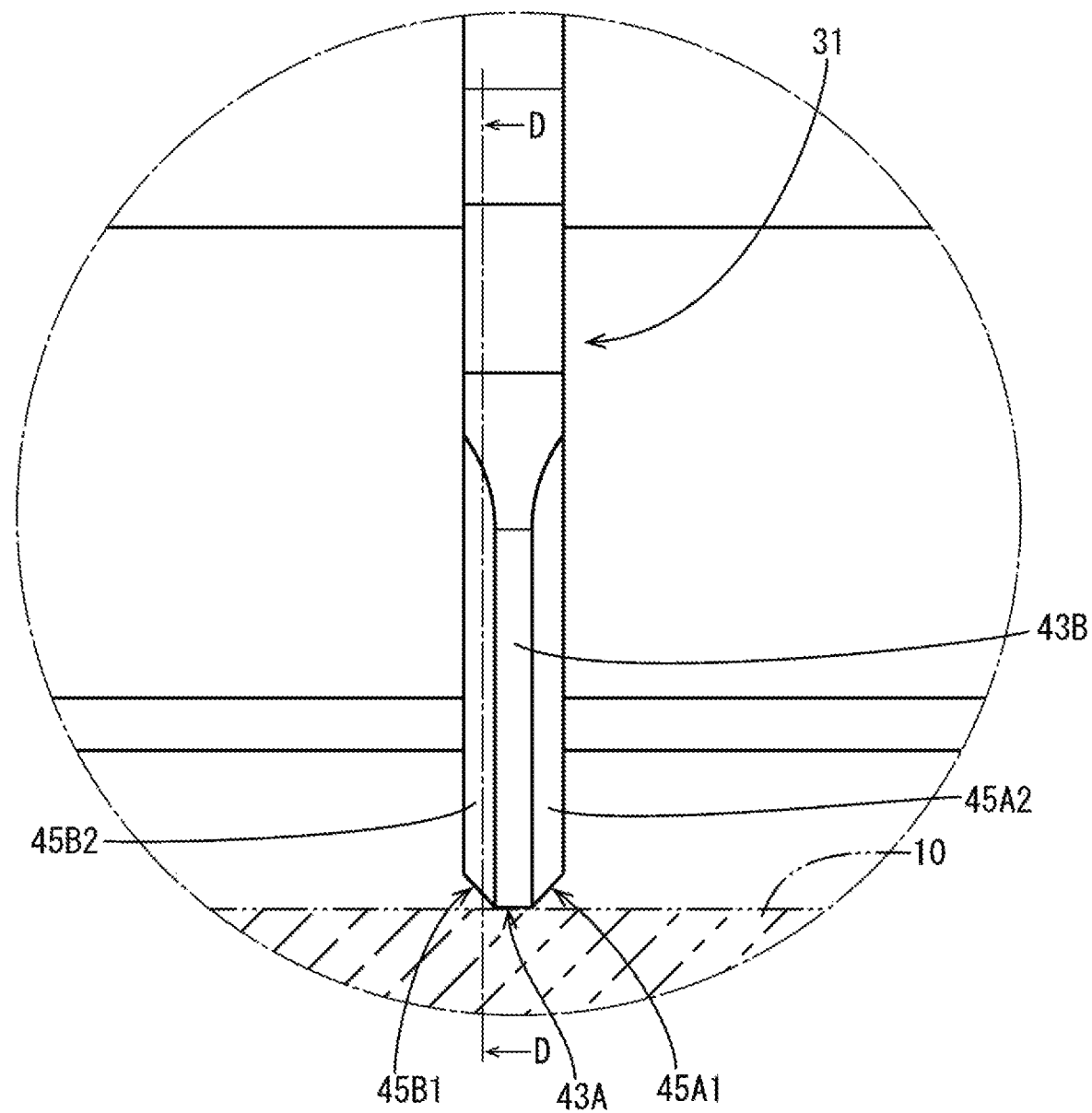
FIG. 7 is an enlarged back view inside a circle R1 of FIG. 2.
Figure 8:
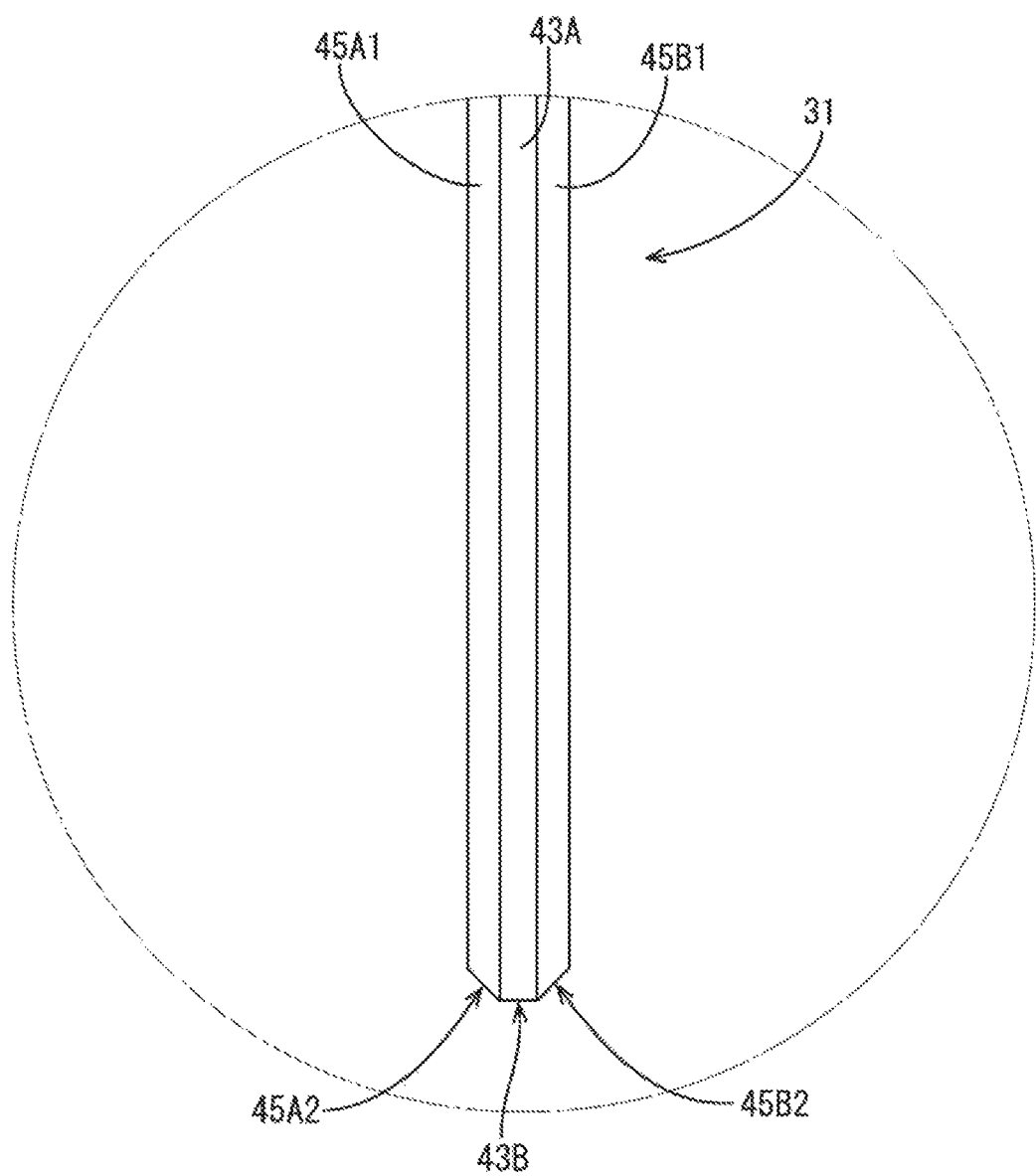
FIG. 8 is an enlarged bottom view inside a circle R2 of FIG. 3.

As shown in FIG. 6, the end 43 of the board connecting portion 31 has a board facing end surface 43A that faces the circuit board 10 when the board connector 20 is mounted on the circuit board 10. A first rising surface 43B (left surface of FIG. 6) rises at an angle from one end of the board facing end surface 43A, and a second rising ends surface 43 rising at an angle from the other end of the board facing end surface 43A.

The two plate surfaces 42A, 42B are covered entirely with the plating layers 44A, 44B. The end surface 43 is formed by stamping and serves as an exposed surface where the base 41 is exposed from the plating layers 44A, 44B.

Figure 10:
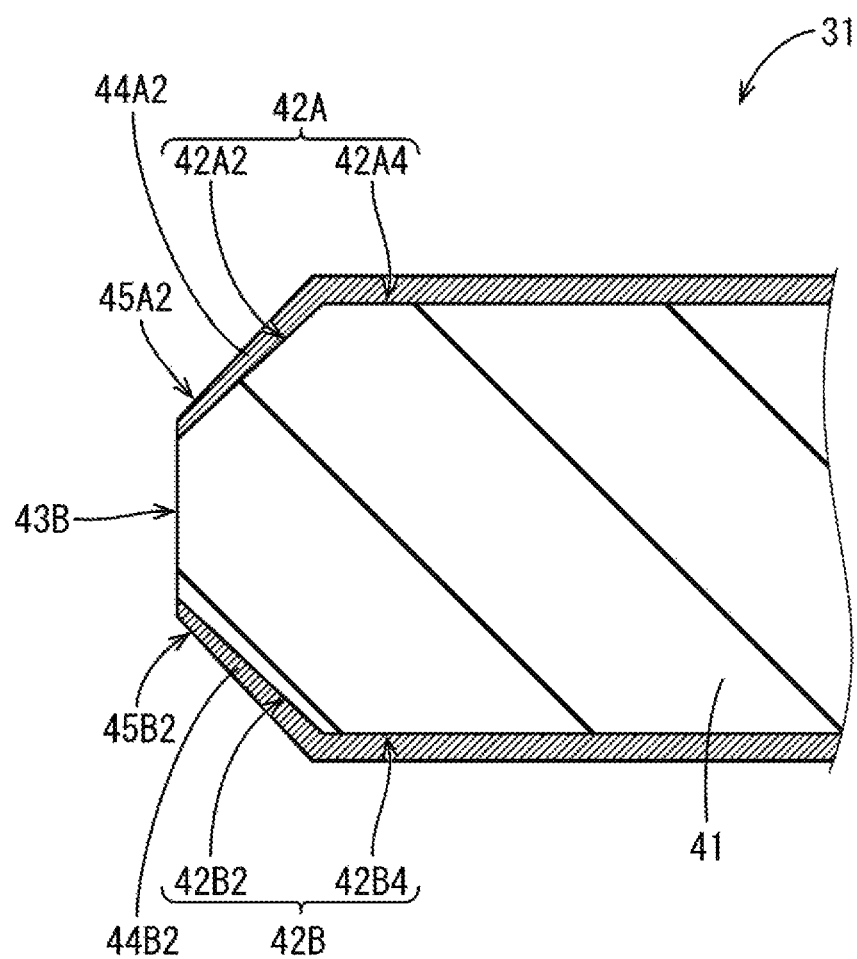
FIG. 10 is a section along B-B of FIG. 6 showing the terminal according to the embodiment.
Figure 11:
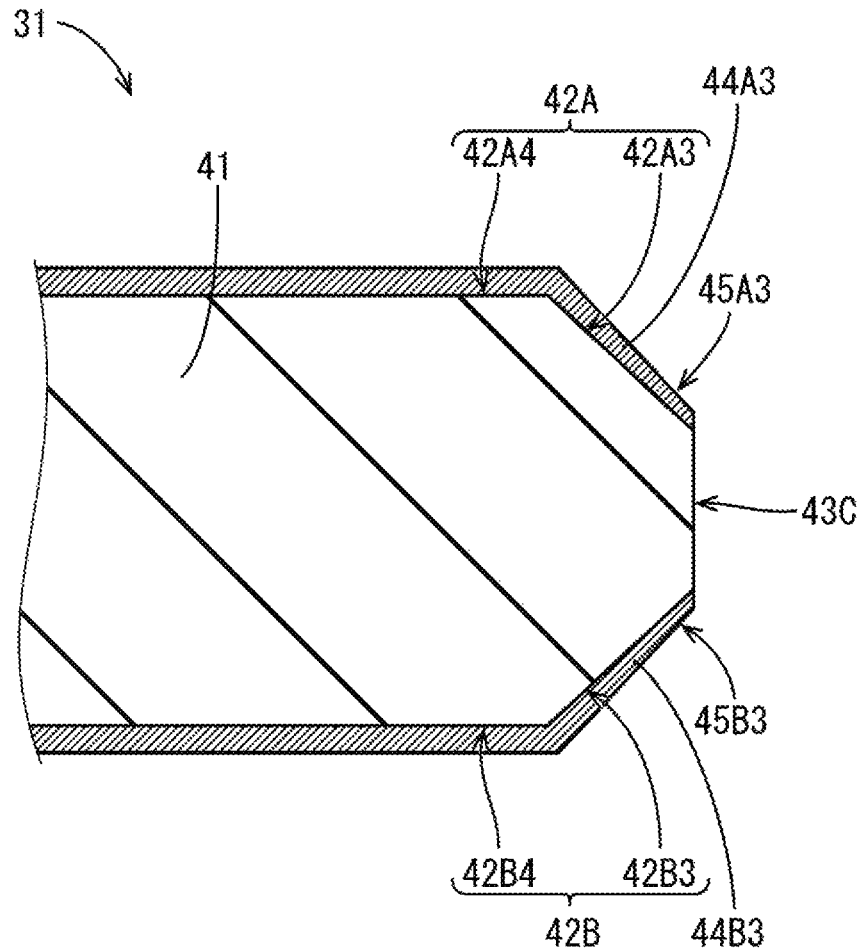
FIG. 11 is a section along C-C of FIG. 6 showing the terminal according to the embodiment.

A facing slope 42A1 is formed on an area of one plate surface 42A adjacent to the board facing end surface 43A, as shown in FIG. 9. A first rising slope 42A2 is formed on an area adjacent to the first rising end surface 43B, as shown in FIG. 10, and a second rising slope 42A3 is formed on an area adjacent to the second rising end surface 43C, as shown in FIG. 11. Areas of the plate surface 42A except the facing slope 42A1, the first rising slope 42A2 and the second rising slope 42A3 form a non-inclined surface 42A4, as shown in FIGS. 9, 10 and 11. The facing slope 42A1, the first rising slope 42A2 and the second rising slope 42A3 respectively link the board facing end surface 43A, the first rising end surface 43B and the second rising end surface 43C to the non-inclined surface 42A4.

The other plate surface 42B similarly has a facing slope 42B1, a first rising slope 42B2, a second rising slope 42B3 and a non-inclined surface 42B4.

As shown in FIGS. 9, 10 and 11, two non-inclined surfaces 42A4, 42B4 are parallel to each other, and the facing slopes 42A1, 42B1, the first rising slopes 42A2, 42B2 and the second rising slopes 42A3, 42B3 are oblique to the non-inclined surfaces 42A4, 42B4.

More specifically, as shown in FIG. 9, the two facing slopes 42A1, 42B1 are inclined to approach each other toward the board facing end surface 43A and a part of the base 41 adjacent to the board facing end surface 43A (part sandwiched by two facing slopes 42A1, 42B1) is tapered toward the board facing end surface 43A. Similarly, as shown in FIG. 10, two first rising slopes 42A2, 42B2 are inclined to approach each other toward the first rising end surface 43B and a part of the base member 41 adjacent to the first rising end surface 43B (part sandwiched by two first rising slopes 42A2, 42B2) is tapered toward the first rising end surface 43B. Similarly, as shown in FIG. 11, two second rising slopes 42A3, 42B3 are inclined to approach each other toward the second rising end surface 43C and a part of the base member 41 adjacent to the second rising end surface 43C (part sandwiched by two second rising slopes 42A3, 42B3) is tapered toward the second rising end surface 43C.

As shown in FIG. 9, the plating layer 44A has a facing inclined part 44A1 covering the facing slope 42A1, and the facing inclined part 44A1 has a facing inclined surface 45A1. Further, as shown in FIG. 10, a first rising inclined part 44A2 covers the first rising slope 42A2, and the first rising inclined part 44A2 has a first rising inclined surface 45A2. Similarly, as shown in FIG. 11, a second rising inclined part 44A3 covers the second rising slope 42A3, and the second rising inclined part 44A3 has a second rising inclined surface 45A3. The facing inclined surface 45A1, the first rising inclined surface 45A2 and the second rising inclined surface 45A3 are inclined respectively along the facing slope 42A1, the first rising slope 42A and the second rising slope 42A3.

The other plating layer 44B also includes similarly configured facing inclined part 44B1, first rising inclined part 44B2, second rising inclined part 44B3, facing inclined surface 45B1, first rising inclined surface 45B2 and second rising inclined surface 45B3.

(Production Method for Terminal 30)

The production method for the terminal 30 according to this embodiment includes a plating step of applying a plating to form plating layers on both surfaces of a plating material for the base to obtain a plated plate, a stamping step of stamping the plated plate to obtain a terminal piece having plated surfaces and an exposed surface and a rolling step of rolling the terminal piece to roll the plating layers and form first inclined surfaces.

Each step is described in detail below with reference to FIGS. 13 to 15.

<Plating Step>

The plating step comprises applying plating to form the plating layers 52 on both surfaces of the plate material 51 for the base to obtain the plated plate 53 (FIGS. 13 and 14).

A processing method such as electroplating, electroless plating or a combination thereof can be adopted for the plating. Electroplating is preferable. In a conventional terminal production method, plating is applied with previously stamped terminals suspended in an electrolytic solution. In this case, plating becomes thicker in a gravitational direction. In the terminal production method of this embodiment, the plate material is plated in advance of stamping. Thus, a uniform plating thickness of the terminal is achieved even with inexpensive electroplating that is suitable for mass production.

A thickness of the plating layer 52 formed by the plating process is, for example, preferably 0.5 µm or more, more preferably 0.7 µm or more, even more preferably 0.9 µm or more, and further preferably 1.0 µm or more. These thicknesses suppress the formation of cracks in the plating layers 52 even if the plating layers 52 are rolled in the rolling step.

The thickness of the plating layer 52 formed by the plating process is, for example, preferably 3.5 µm or less, more preferably 3.3 µm or less, even more preferably 3.1 µm or less, and further preferably 3.0 µm or less. These thicknesses ensure sufficient solder wettability while reducing the cost of the plating process.

<Stamping Step>

The stamping step stamps the plated plate 53 to obtain a terminal piece 30P having plated surfaces and an exposed surface (FIG. 15).

A stamping method is not limited. Specific examples of the stamping method include a method for pressing a plated plate using a press die.

The shape of the terminal piece 30P is not limited, but the terminal piece 30P preferably is stamped to have the shape shown in FIG. 15 for producing the terminal 30 shown in FIG. 4. As shown in FIG. 15, the terminal piece 30P has two nonlinear portions 34, 35 and a board connecting piece 31P that becomes the board connecting portion 31. The terminal 30 can be formed without being bent. Specifically, the terminal piece 30P is stamped to include the nonlinear portions 34, 35. According to this method, bending need not be performed after stamping to form the nonlinear portions necessary for the board connecting portion 31 and the intermediate portion 32, and the influence of springback need not be considered, thereby improving dimensional accuracy of the terminal 30.

Figure 16:
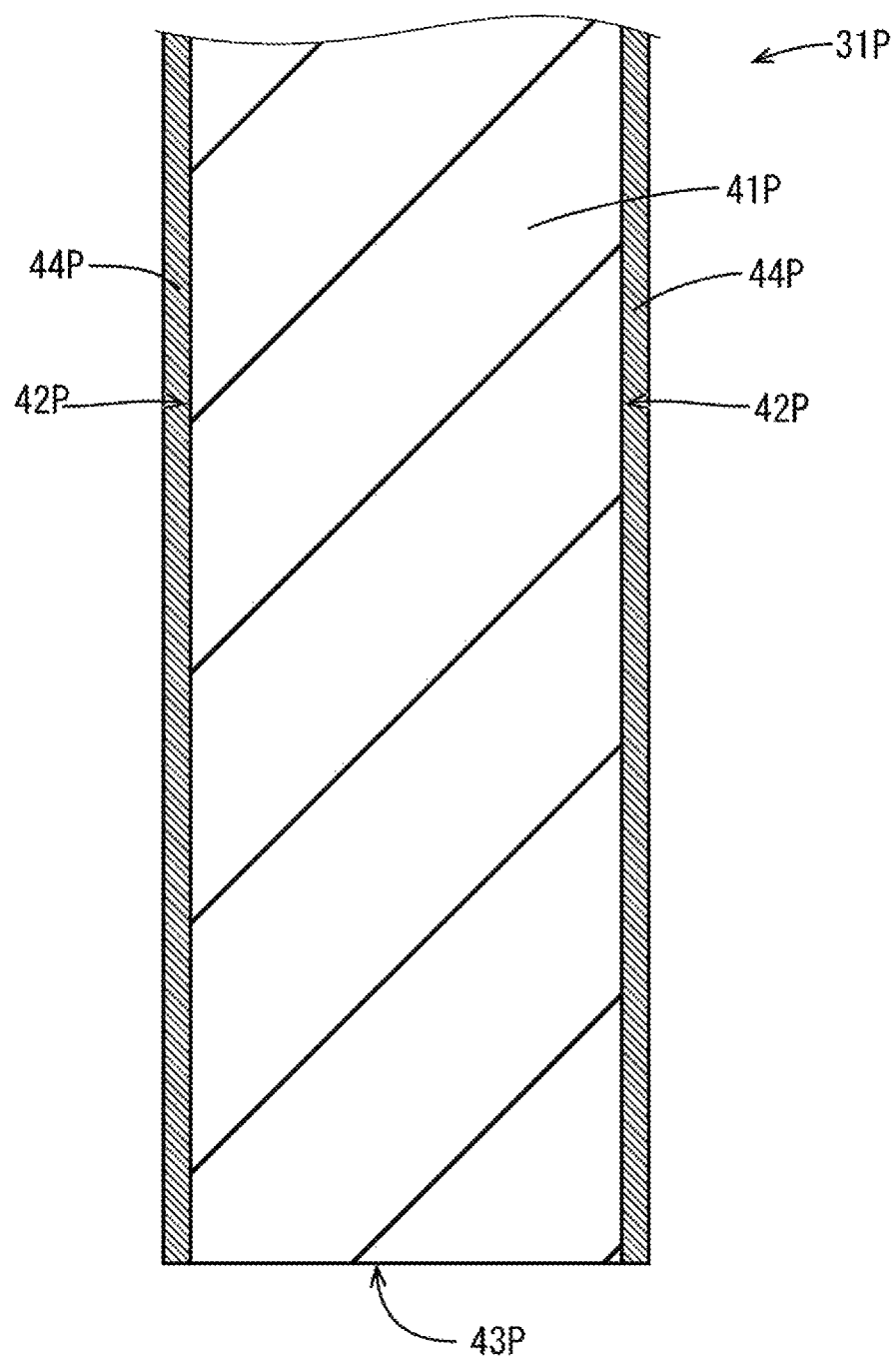
FIG. 16 is a section along E-E of FIG. 15 showing a board connecting piece portion.

FIG. 16 is cross-section along line E-E of FIG. 15 and shows that the terminal piece 30P includes a piece base member 41P which becomes the base 41, and plating layers 44P.

The piece base member 41P has two plate surfaces 42P covered by the plating layers 44P and a fracture surface 43P formed by stamping and linking the two plate surfaces 42P. The fracture surface 43P is not covered by the plating layers 44P and serves as an exposed surface where the piece base member 41P is exposed.

<Rolling Step>

The terminal piece 30P is rolled in the rolling step to roll the plating layers and to form the first inclined surfaces. A rolling method is not limited. Specific examples of the rolling method include a method for pressing the terminal piece 30P using a die.

In this way, the base member 41P of the terminal piece 30P is pressed to form the slopes of the terminal 30. Further, the plating layers 44P of the terminal piece 30P are pressed to form the first inclined surfaces of the terminal 30.

The board connecting piece portion 31P is pressed by the rolling step. In this way, the facing slopes 42A1, 42B1, facing inclined parts 44A1, 44B1, first rising slopes 42A2, 42B2, second rising slopes 42A3, 42B3, first rising inclined parts 44A2, 44B2 and second rising inclined parts 44A3, 44B3 are formed.

(Average Values of Plating Thicknesses)

Average values of plating thicknesses of the facing inclined part 44B1, the first rising inclined part 44B2 and the second rising inclined part 44B3 are, for example, preferably 0.5 µm or more, more preferably 0.7 µm or more, even more preferably 0.9 µm or more and further preferably 1.0 µm or more, and preferably 3.5 µm or less, more preferably 3.3 µm or less, even more preferably 3.1 µm or less and further preferably 3.0 µm or less. In this way, the terminal is excellent in long-term reliability and plating uniformity.

(Standard Deviations of Plating Thicknesses)

Standard deviations of the plating thicknesses of the facing inclined part 44B1, the first rising inclined part 44B2 and the second rising inclined part 44B3 are, for example, preferably 0.40 µm or less, more preferably 0.35 µm or less, even more preferably 0.30 µm or less and further preferably 0.25 µm or less. In this way, the terminal is excellent in long-term reliability and plating uniformity.

Subsequent to the rolling step, the terminal may be bent. Examples of bending include bending to form the terminal connecting portion 33 and bending to form bent parts.

The stamping step preferably is performed so that bending to form the bent parts is not performed. In this way, the influence of springback need not be considered. This is preferable in terms of being able to improve the dimensional accuracy of the terminal 30.

(Method for Producing Board Connector 20)

The board connector 20 of this embodiment is produced by press-fitting the terminal connecting portions 33 into the corresponding terminal press-fit holes 24 to mount the terminals 30 into the connector housing 21.

(Method for Producing Board with Connector)

The board with connector is produced by mounting the board connector 20 on the circuit board 10, such as by reflow soldering. More particularly, solder H is applied in advance to locations of one surface of the circuit board 10 where soldering is planned. Subsequently, the board connector 20 is placed at a predetermined position on the circuit board 10.

At this time, each terminal 30 is disposed to be vertical to the circuit board 10, the board connecting portion 31 is placed on the solder H, and the board facing end surface 43A is disposed to face the circuit board 10. Further, each fixing bracket 27 also is placed on the solder H.

Subsequently, the circuit board 10 having the board connector 20 placed thereon is caused to travel in an unillustrated reflow furnace, thereby melting the solder H. Thereafter, when the solder H is cooled and solidified, the board connecting portion 31 of each terminal 30 is fixed to the corresponding conductive path to establish electrical conduction and each fixing bracket 27 is fixed to the circuit board 10. In this way, the board connector 20 is fixed to the circuit board 10.

At the time of reflow soldering, the solder H is melted by the heat of the reflow furnace and, as shown in FIG. 9, spreads in a wet manner to the board facing end surface 43A and the facing slopes 42A1, 42B1 so that the board facing end surface 43A is embedded in the solder H. The board facing end surface 43A faces the circuit board 10 and forms an exposed non-plated connection surface to the circuit board 10 where the base member 41 is exposed, as shown in FIG. 9. Thus, the wettability of the solder H may be inferior as compared to the plated surfaces. However, an area of the board facing end surface 43A is made relatively smaller by rolling as described above so that sufficient wettability is exhibited. Further, the facing slopes 42A1, 42B1 adjacent to the board facing end surface 43A are inclined toward the circuit board 10, and these facing slopes 42A1, 42B1 also work as connection surfaces to the circuit board 10. The facing slopes 42A1, 42B1 are covered by the plating layers 44A, 44B and have good wettability of the solder H. Therefore, the solder H smoothly spreads up in a wet manner to form good solder fillets. In this way, the connection reliability of the terminal 30 to the circuit board 10 is improved.

Further, the solder H also spreads in a wet manner to the first rising end surface 43B and the first rising slopes 42A, 42B2. Similar to the board facing end surface 43A, the first rising end surface 43B also is an exposed surface that is not plated and where the base member 41 is exposed. Thus, the wettability of the solder H may be inferior as compared to the plated surfaces. However, an area of the first rising end surface 43B is made smaller by rolling, as described above, so that sufficient wettability can be exhibited. Further, the first rising slopes 42A2, 42B1 adjacent to the first rising end surface 43B are covered by the plating layers 44A, 44B and have good wettability of the solder H. Thus, the solder H smoothly spreads up in a wet manner to form good solder fillets (see FIG. 12). If a load is applied to the terminal 30, stress is concentrated around the first rising end surface 43B and the solder H crack. However, solder spreads up in a wet manner around the first rising end surface 43B. Therefore, the terminal 30 provides a strong connection to the circuit board 10.

The same applies also to the second rising end surface 43C and the second rising slopes 42A3, 42B3.

Note that the present invention is not limited to the above embodiment and modifications and improvements within such a range that the aim of the present invention can be achieved are also included in the present invention.

Example

The invention is described in detail below by way of Example, but the present invention is not to limited this Example.

First, a plate material made of copper alloy and having a thickness of 0.1 mm was prepared as a material of the base member of the terminal. Subsequently, electroplating was applied to both surfaces of the metal plate material to form plating layers made of tin plating and obtain a plated plate. Note that thicknesses of the plating layers formed on the metal plate material were 1.8 μm.

Subsequently, the plated plate was stamped to form the terminal piece. The shape of the terminal piece is a shape before the terminal connecting portion 33 was bent in FIG. 4. A stamping direction by a press body was set to stamp the plate material into the shape before the terminal connecting portion 33 of FIG. 4 was bent with the plate material viewed from above. Subsequently, the terminal piece was pressed using a die to roll the plating layers of the terminal piece. Subsequently, the terminal connecting portion of the terminal piece was bent to obtain the terminal according to this Example.

(Confirmation of Plating Thicknesses)

Figure 12:
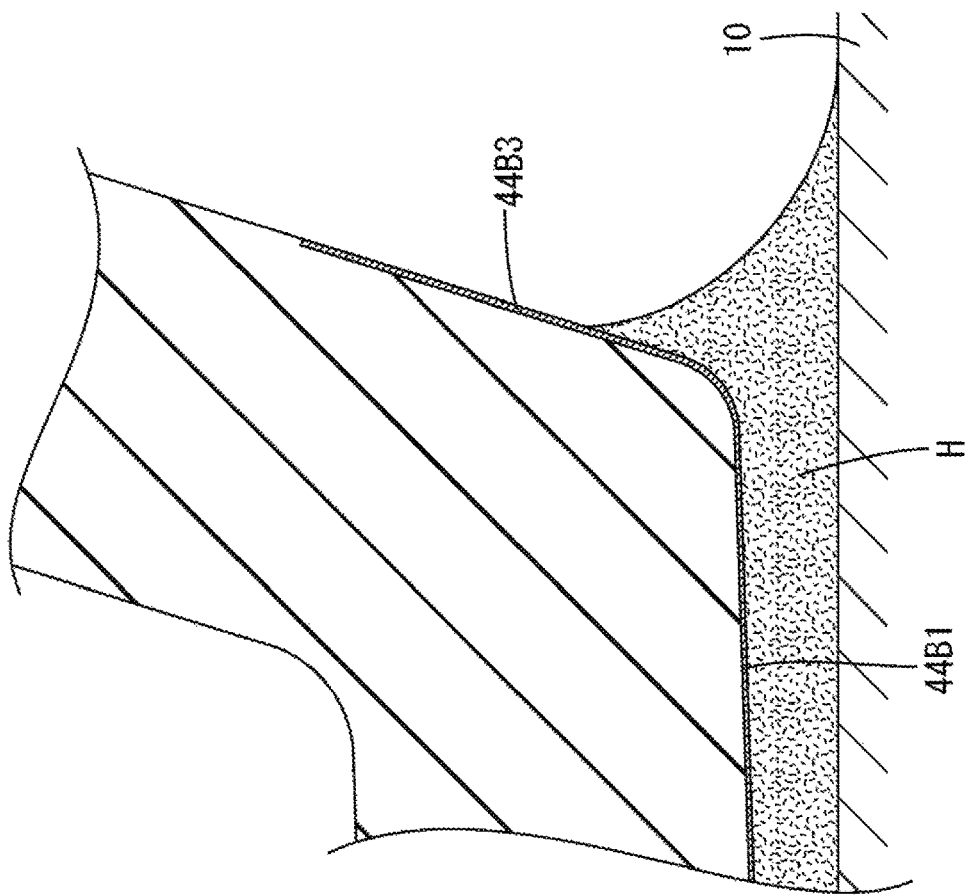
FIG. 12 is a section along D-D of FIG. 7 showing the state where the board connecting portion in the terminal according to the embodiment is soldered to the circuit board.
Figure 12:
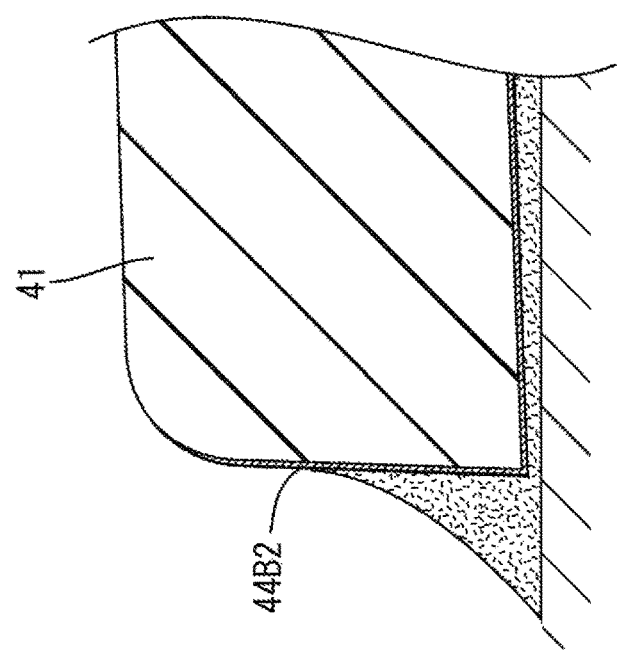

The plating thickness was measured at the position of each of the facing inclined part 44B1, the first rising inclined part 44B2 and the second rising inclined part 44B3 of FIG. 12, using a fluorescent X-ray film thickness meter (SFT 9550X produced by Hitachi High-Tech Science Corporation). A measurement range $\phi$ of 0.03 mm was set as a measurement condition, and the thicknesses were evaluated and averaged for arbitrary five points. Measurement results are shown in Table 1 below.

Further, an average value and a standard deviation of the plating thicknesses at the positions of the facing inclined part 44B1, the first rising inclined part 44B2 and the second rising inclined part 44B3 were calculated. These values are also shown in Table 1.

TABLE 1

|  | Plate Thickness (μm) |
| --- | --- |
| Facing Inclined Part | 1.37 |
| First Rising Inclined Part | 1.24 |
| Second Rising Inclined Part | 1.77 |
| Average Value | 1.46 |
| Standard Deviation | 0.23 |

The terminal according to Example was confirmed to maintain sufficient solder wettability as compared to conventional terminals. Further, production cost was confirmed to be reduced even as compared to terminals produced by the conventional pre-plating method.

LIST OF REFERENCE SIGNS

10 . . . circuit board
20 . . . board connector
21 . . . connector housing
22 . . . housing body
23 . . . terminal holding wall
24 . . . terminal press-fit hole
25 . . . fixing wall
26 . . . fixing bracket press-fit hole
27 . . . fixing bracket
30 . . . terminal
30P . . . terminal piece
31 . . . board connecting portion
31P . . . board connecting piece
32 . . . intermediate portion
33 . . . terminal connecting portion
34 . . . first nonlinear portion (nonlinear part)
35 . . . second nonlinear portion (nonlinear part)
41 . . . base
41P . . . piece base member
42A, 42B . . . plate surface
42A1, 42B1 . . . facing slope (slope)
42A2, 42B2 . . . first rising slope (slope)
42A3, 42B3 . . . second rising slope (slope)
42A4, 42B4 . . . non-inclined surface (plated surface)
42P . . . plate surface
43 . . . end surface
43A . . . board facing end surface (exposed surface)
43B . . . first rising end surface (rising surface)
43C . . . second rising end surface (rising surface)
43P . . . fracture surface
44A, 44B . . . plating layer
44A1, 44B1 . . . facing inclined part
44A2, 44B2 . . . first rising inclined part
44A3, 44B3 . . . second rising inclined part
44P . . . plating layer
45A1, 45B1 . . . facing inclined surface (first inclined surface)
45A2, 45B2 . . . first rising inclined surface (second inclined surface)
45A3, 45B3 . . . second rising inclined surface (second inclined surface)
51 . . . plate material
52 . . . plating layer
53 . . . plated plate
H . . . solder

What is claimed is:

1. A terminal with a board connecting portion to be connected to a circuit board, comprising:
   a base; and
   a plating layer;
   wherein:
   the base has a plated surface covered by the plating layer and an exposed surface;
   the plating layer has a first inclined surface for covering a slope connecting the plated surface and the exposed surface in the board connecting portion;
   the board connecting portion has a rising surface rising at an angle from the exposed surface;
   the rising surface exposes the base; and
   the plating layer has a second inclined surface for covering a slope connecting the plated surface and the rising surface.

2. The terminal of claim 1, wherein the plating layer contains Sn.

3. The terminal of claim 1, comprising a nonlinear part.

4. The terminal of claim 1, wherein a thickness of the base is 0.05 mm or more and 0.80 mm or less.

5. A board connector, comprising:
   the terminal of claim 1; and
   a connector housing for holding the terminal.

6. A board with connector, comprising:
   the board connector of claim 5;
   a circuit board on which the board connector is mounted; and
   solder for connecting the circuit board and the board connecting portion;
   the exposed surface being arranged to face the circuit board.

7. The board with connector of claim 6, wherein the exposed end surface is embedded in the solder.

8. A terminal production method for producing a terminal, comprising:
- providing a plate material having opposite first and second surfaces
- applying plating to form first and second plating layers respectively on the first and second surfaces of the plate material to obtain a plated plate;
- stamping the plated plate to obtain a terminal piece having the first and second plated surfaces and an exposed surface extending between the first and second plated surfaces; and
- rolling the terminal piece at areas of the first and second plating layers adjacent the exposed surface to form first and second inclined plated surface areas that are inclined toward the exposed surface.

9. The terminal production method of claim 8, wherein a plating process is electroplating.

10. A terminal (30) with a board connecting portion (31) to be connected to a circuit board (10), comprising:
- a base (41) including:
  - a first non-inclined surface (42A1) and a second non-inclined surface (42B1) facing oppositely from one another,
  - first inclined surfaces (42A2, 42A3, 42A4) extending from the first non-inclined surface (42A1) and second inclined surfaces (4262, 4263, 4263) extending from the second non-inclined surfaces (4261), and
  - end surfaces (43A, 43B, 43C) extending from the first inclined surfaces (42A2, 42A3, 42A4) to the second inclined surfaces (42B2, 42B3, 42B3); and
- a plating layer (44A, 44B) covering the base (41) across the first and second non-inclined surfaces (42A1, 42B1) and the first and second inclined surfaces (42A2, 42A3, 42A4; 42B2, 42B3, 42B3);

wherein:
- the base (41) is exposed at the end surfaces (43A, 43B, 43C) between the first inclined surfaces (42A2, 42A3, 42A4) and the second inclined surfaces (42B2, 42B3, 42B3); and
- at least a first of the exposed end surfaces (43A) defines a part of the board connecting portion (31) that is to be connected to a circuit board (10).

11. The terminal of claim 1, comprising a nonlinear part extending from the board connecting portion.

12. The terminal of claim 1, wherein a thickness of the base is 0.05 mm or more and 0.80 mm or less.

* * * * *